United States Patent [19]

Lind

[11] 4,371,749
[45] Feb. 1, 1983

[54] CIRCUIT FOR PROCESSING ANGLE MODULATED BROADCAST SIGNALS

[75] Inventor: Laurel R. Lind, Auburn, Ind.

[73] Assignee: Magnavox Consumer Electronics Co., Fort Wayne, Ind.

[21] Appl. No.: 159,360

[22] Filed: Jun. 13, 1980

[51] Int. Cl.³ .......................... H04H 5/00; H04B 1/10
[52] U.S. Cl. ................................ 179/1 GS; 455/212; 455/210
[58] Field of Search ...................... 179/1 GS, 1 GD; 329/122, 136, 135, 147, 167; 455/212, 208, 210, 211

[56] References Cited

U.S. PATENT DOCUMENTS 2,395,737  2/1946  Hansell ................................ 455/212
2,462,224  2/1949  Rheams .............................. 455/210
4,066,845  1/1978  Kishi .................................. 455/212
4,159,396  6/1979  Hilbert et al. ..................... 179/1 GS

OTHER PUBLICATIONS

"AM Stereo Soon on the Air", by Deangelo, *Popular Electronics* Dec. 1978, pp. 59-64.

*Primary Examiner*—Douglas W. Olms
*Attorney, Agent, or Firm*—Pollock, Vande Sande & Priddy

[57]     ABSTRACT

A circuit is described for maintaining an input signal to a limiter used to limit amplitude excursions of a signal to be angle demodulated. Means are provided for detecting a temporary loss in signal to said limiter resulting from the loss of signal due to large negative amplitude modulation or other factors. When the amplitude of the angle modulated wave falls below a predetermined minimum, a substitute intermediate frequency signal is generated to maintain the limiter in a limiting condition during the temporary loss in broadcast signal. The substitute intermediate frequency signal has a frequency substantially equivalent to the intermediate frequency signal developed from the broadcast signal during periods when the amplitude of the broadcast signal is adequate. The substitute signal prevents the occurrence of noise generated from an angle demodulator due to a temporary loss in signal.

7 Claims, 3 Drawing Figures

CIRCUIT FOR PROCESSING ANGLE MODULATED BROADCAST SIGNALS

BACKGROUND OF INVENTION

The present invention relates to receivers for demodulating angle modulated broadcast signals. Specifically, a circuit for processing angle modulated waves from a broadcast signal also containing amplitude modulation components is provided.

Recently there have been proposed systems for generating stereophonic broadcast signals in the low frequency radio spectrum currently authorized for amplitude modulation broadcasts. In one system proposed by the Magnavox Consumer Electronics Company, as set forth in FCC docket 21313, In the Matter of AM Stereophonic Broadcasting; hereby incorporated by reference, two stereophonically related signals R (t) and L (t) are summed together to form a summation signal. The summation signal modulates the amplitude of the broadcast signal comprising a monophonic broadcast received by listeners having radio receivers of conventional design. The stereophonic related signals are also subtractively combined to provide a difference signal L (t)−R (t). The difference signal is used to linearly phase modulate the broadcast carrier. Receivers of conventional design are transparent to the linear phase modulation, and are not effected by the presence of the difference signal. However, receivers which have a linear phase demodulator for demodulating the phase excursions of the intermediate frequency signal produced in a broadcast radio receiver will derive the L−R information which when combined with the AM detected L+R information will generate stereophonically related signals which may be amplified and applied to separate speakers.

Some difficulty in demodulating a stereophonic signal in accordance with the above has been found in that large negative amplitude modulation peaks, those exceeding 95%, result in a temporary loss of signal to the phase demodulator. During the time that no input signal is supplied to the phase demodulator, there can be a generation of noise in that the phase demodulator attempts to detect the phase content of noise which appears at the input during periods when a loss of intermediate frequency signals is experienced. The noise bursts which occur under these high amplitude modulation conditions can be objectionable to a listener and in general will impair the quality of stereophonic reception available in the low frequency broadcast band.

SUMMARY OF INVENTION

It is an object of this invention to continuously provide an intermediate frequency signal to an angle demodulator means.

It is a further object of this invention to maintain a signal to a phase demodulator of a stereophonic receiver during periods when a broadcast signal is temporarily below a minimum amplitude.

These and other objects are accomplished by a circuit in accordance with the invention which maintains an input signal to a limiter used to limit amplitude excursions of a signal to be angle demodulated. Means for detecting a temporary loss in signal to said limiter are provided to detect a loss of signal which results from large negative amplitude modulation on an angle modulated wave, such as is produced in the aforementioned AM stereophonic broadcasting system as proposed by the Magnavox Consumer Electronics Company. When excessive negative amplitude modulation is present on a carrier signal, a loss of intermediate frequency signal occurs. The present invention provides a substitute intermediate frequency signal upon the detection of a loss in broadcast signal or its corresponding intermediate frequency signal, or when the amplitude of the broadcast signal drops below a predetermined minimum.

In a preferred embodiment of the invention, the substitute signal is generated by applying a feedback signal to an amplifier which supplies the intermediate frequency signal to a limiter during a condition of high negative amplitude modulation of a broadcast signal. During the time that negative modulation peaks exceed a predetermined minimum, the amplifier circuit is forced into oscillation at substantially the intermediate frequency and a subsequent angle demodulator which may be a frequency discriminator, or phase demodulator, is supplied with the oscillating signal. During the demodulation of a broadcast signal, the angle demodulator is at all times supplied with a signal at substantially the intermediate frequency of the receiver. Therefore, the generation of noise inherent in angle demodulator receivers in response to a loss of broadcast signal whether temporary or not, is avoided.

DESCRIPTION OF THE PREFERRED EMBODIMENT

Figure 1:
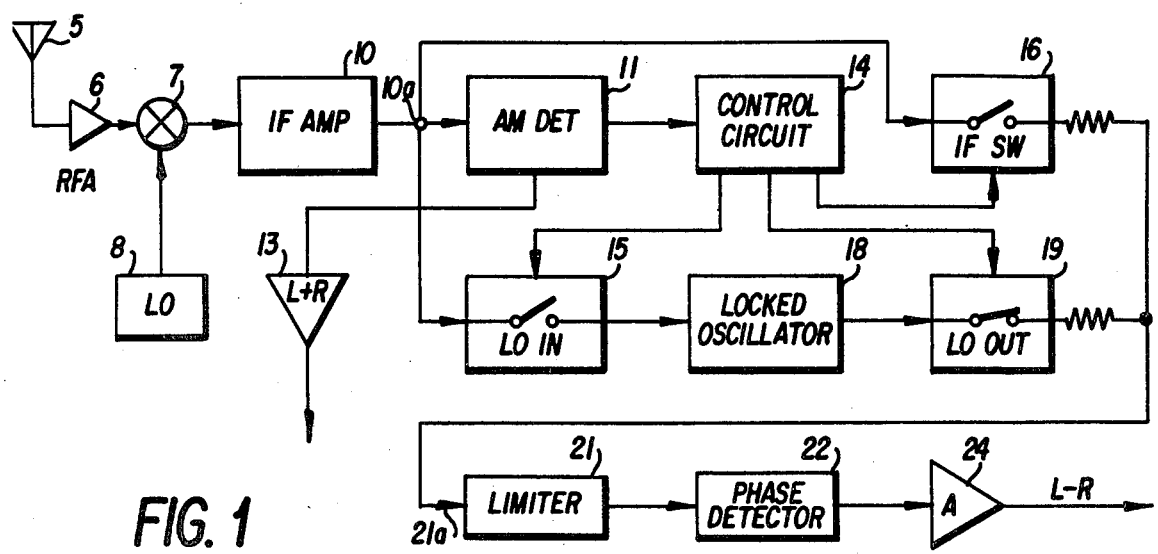
FIG. 1 is a block diagram of one embodiment of apparatus for generating a substitute intermediate frequency signal.

FIG. 1 is a block diagram illustrating apparatus for maintaining an intermediate frequency signal, hereinafter IF signal, to a limiter when the amplitude of a received broadcast signal is below a predetermined minimum. The apparatus contains the familiar elements known to those skilled in the art of a superheterodyne receiver to derive an IF signal. Antenna 5 conveys a broadcast signal to radiofrequency amplifier 6. The output of radiofrequency amplifier 6 is mixed in a known way by mixer 7 with the local oscillator signal provided by local oscillator 8. The resulting intermediate frequency signal is amplified by an I.F. amplifier 10. The intermediate frequency signal is thereafter demodulated by the circuitry of FIG. 1 to provide an L+R signal proportional to amplitude modulation contained in the broadcast signal, and an L−R signal proportional to a phase modulation of the intermediate frequency signal.

Figure 2:
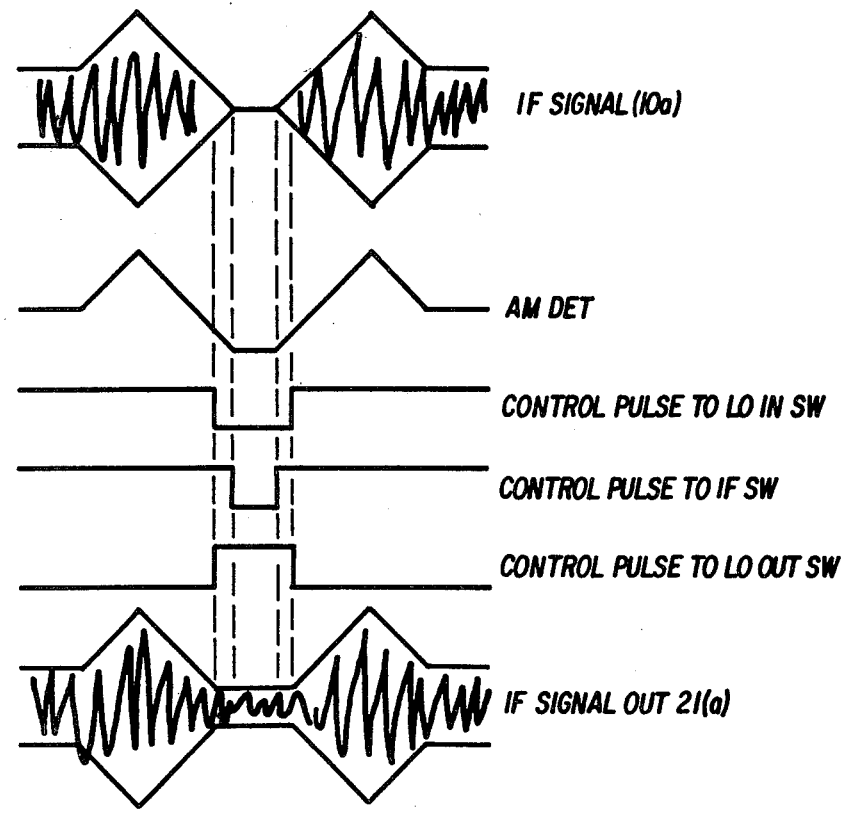
FIG. 2 illustrates circuit waveforms produced in the apparatus of FIG. 1.

Referring to FIG. 2, there is shown an intermediate frequency signal from IF amplifier 10. Because of the high negative amplitude modulation peaks appearing on a broadcast signal received by antenna 5, the intermediate frequency signal goes to zero during a portion of the broadcast signal which has negative modulation peaks in excess of 95%. During this period of time, AM detector 11 provides zero output voltage indicative of the condition of amplitude modulation on the broadcast signal. Amplifier 13 provides the detected output of the AM detector 11 to a matrix means not shown where it is combined with a difference signal to derive left and right stereophonically related signals. During the interval that the condition of the intermediate frequency signal is above a predetermined amplitude, IF switch 16 is closed thereby providing the intermediate frequency signal directly to limiter 21. Limiter 21 limits the amplitude excursions of the input signal in a known way before applying it to a phase detector 22. Phase detector 22 provides a voltage which varies according to the angle modulated components appearing on the wave which in the aforementioned system of stereophonic broadcasting are phase modulation components. Amplifier 24 amplifies the demodulated signal as an L−R signal. The L−R signal is matrixed in a known way with the L+R signal to derive two stereophonically related signals L, and R.

The present invention provides for the substitution of the intermediate frequency signal from IF amplifier 10 with a internally generated intermediate frequency signal. The advantage of such a scheme is to always provide limiter 21 with a signal avoiding a condition whereby phase detector 22 is without an input signal and produces noise in an effort to detect phase modulation in the absent broadcast carrier signal.

The substitute IF signal generated by a locked oscillator 18 which has a frequency predetermined to be the intermediate frequency of a signal from IF amplifier 10. Oscillator 18 is frequency locked to the intermediate frequency signal provided by IF amplifier 10 during closure of switch 16 by means of switch 15 also closed. The oscillator output signal is interrupted by a switch 19 which couples the output signal to limiter 21.

Referring now to FIG. 2, the operation of the apparatus of FIG. 1 may be more completely understood. The IF signal from intermediate frequency amplifier 10 is detected by an AM detector 11. AM detector 11 has an output signal which indicate the relative percentage of negative amplitude modulation present on the incoming broadcast signal. Control circuit 14 detects this level, and when the negative modulation percentage of the input I.F. signal is below a predetermined amount, which the inventor has selected to be 95% in a preferred embodiment, a pulse is produced to switch 15 disconnecting the locked oscillator 18 from intermediate frequency amplifier 10. At the same instant, a control pulse is provided to switch 19 closing the switch, whereby the output of the locked oscillator 18 is supplied to a limiter 21. When the intermediate frequency signal from IF amplifier 10 reaches a minimum level a third control pulse is produced to open switch 16.

The result of the foregoing circuitry is the generation of a substitute IF signal which maintains the phase detector 22 with an input IF signal with a predetermined minimum amplitude. Limiter 21 is always maintained in a limiting condition which reduces noise bursts likely to occur when a limiter 21 loses signal because of a loss in carrier or when the limiter is receiving a signal having an amplitude below an effective level to maintain limiting.

Thus there is described with respect to one embodiment an apparatus for maintaining an intermediate frequency signal for all levels of amplitude modulation which may occur on a broadcast signal.

Figure 3:
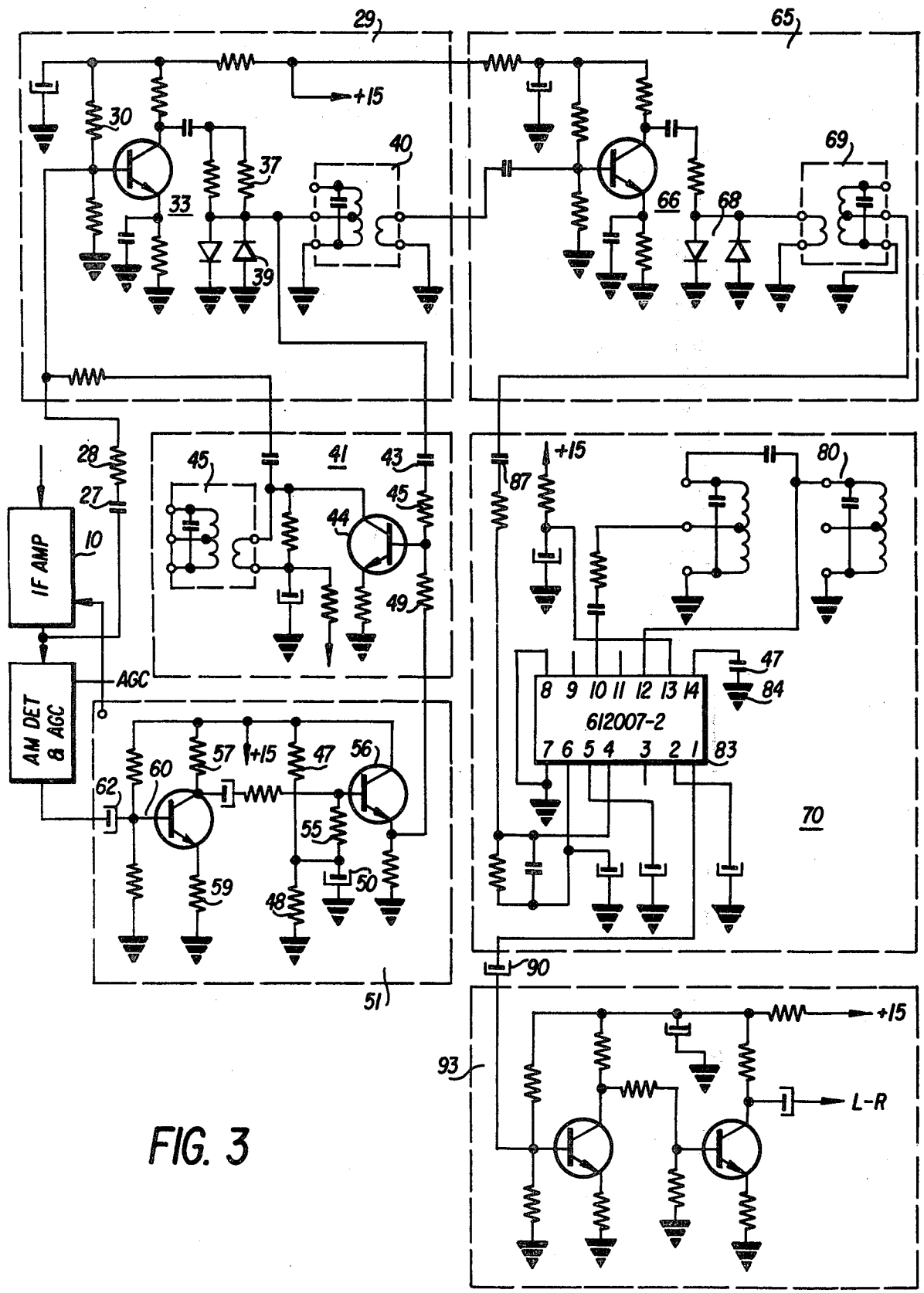
FIG. 3 illustrates a more preferred embodiment of apparatus for generating a substitute intermediate frequency signal.

A more preferred embodiment of the invention is shown in FIG. 3. The subject matter of FIG. 3 differs from FIG. 1 in that the substitute intermediate frequency signal is derived by forcing an amplifier which supplies a signal to a limiter into oscillation at the intermediate frequency during those periods of reception where the broadcast signal amplitude falls below a minimum level. Referring more particularly to FIG. 3, a signal from an intermediate frequency amplifier 10 is derived by conventional superheterodyne techniques and is coupled to capacitor 27 and resistor 28 to a common emitter amplifier 33. Amplifier 33 known to those skilled in the art has associated therewith a biasing network 30 for providing the typical class A operation of the amplifier. The amplifier typically has a gain of 10 and the output thereof is capacitively coupled to a feed resistor 37. Feed resistor 37 couples the amplified IF signal to two back to back diodes 39 whereby the signal is limited in amplitude to the forward bias voltage of each of the diodes 39 which is typically 0.6 volts. The limited signal is thereafter applied to IF transformer 40 known to those skilled in the art having a tuned band pass characteristic centered at approximately the intermediate frequency. IF transformer 40 will provide a intermediate frequency signal limited in amplitude to a second amplifier limiter circuit 65. Amplifier circuit 65 amplifies the signal with the standard common emitter amplifier 66, and thereafter limits it with two back to back diodes 68. A transformer 69 also tuned to the intermediate frequency signal supplies the limited intermediate frequency signal in a known manner to a phase demodulator 70.

Phase demodulator 70 is a conventional frequency discriminator 83 having a deemphasizing capacitor 84. The deemphasizing point is selected to be in the neighborhood of 20 to 30 cycles whereby the discriminator acts more nearly as a phase detector rather than a frequency modulation detector. Transformer 80 provides inter stage coupling for the discriminator 83 and is similarly tuned to have a band pass characteristic centered around the intermediate frequency.

The output signal from the phase demodulator 70 is applied through a coupling capacitor 90 to a two stage common emitter amplifier 93 biased to provide class A operation whereby a linear, proportional L−R signal is produced which may be combined with a L+R signal in a known manner.

The substitute signal for the apparatus of FIG. 3 is derived by forcing amplifier 33 into oscillation during those periods when the broadcast signal has an amplitude below a predetermined minimum.

The oscillation of amplifier 33 is effected by supplying a feedback signal through capacitor 43 and resistor 45 to the base transistor 44 which comprises an attenuator 41. During periods when the intermediate frequency signal having an adequate amplitude is being received, detector 51 maintains transistor 44 in a non-conducting state. At the time a minimum amplitude intermediate frequency signal is detected by threshold detector 51, transistor 44 will supply the feedback signal in amplified form to the base of the transistor comprising the common emitter amplifier 33. Transistor 44 when enabled by the threshold detector 51 amplifies the feedback signal and provides phase inversion thereof, such that the signal will force transistor amplifier 33 into oscillation at the intermediate frequency. The collector output circuit of transistor 44 is similarly tuned with an intermediate frequency transformer 45 to ensure that the feedback signal has a proper phase and amplitude at the frequency of interest for forcing amplifier 33 into oscillation.

Threshold detector 51 is of conventional design comprising a transistor 56 operably biased by resistors 47 and 48. The bias point set by resistors 47 and 48 maintains transistor 56 slightly biased into conduction when the signal from the AM detector is above a predetermined minimum. The AM detector provides a signal proportional to the amplitude modulation level appearing on the broadcast signal being received. This is accomplished through the well known technique of amplitude detecting the intermediate frequency signal. The detected output signal from the AM detector is amplified by transistor 60 also operated as a common emitter, class A amplifier. Resistors 47 and 48 were selected to be 18,000 ohms and 1,000 ohms respectively thereby establishing a threshold voltage of approximately 0.75 volts. Negative going detected signals from the AM detector representing the level of negative amplitude modulation on the received broadcast signal, are seen at the output of amplifier 60 as positive going signals. When these positive going signals exceed a threshold of 0.75 volts, transistor 56 is driven further into conduction than the minimum conduction permitted by the 0.75 bias voltage. The effect of the increased conduction of transistor 56 is such that transistor 44 becomes forward biased and amplification takes place in transistor 44. The amplified signal derived from transistor 44 is AC coupled into the input of transistor 33 whereby oscillation commences.

Thus, during those periods of reception when a broadcast signal exceeds approximately 95% negative modulation, corresponding to a signal of 0.75 volts appearing at the base of transistor 56, amplifier limiter 29 goes into oscillation at substantially the intermediate frequency. Oscillation occurs because a regenerative loop is formed with amplifier 33, attenuator feedback network 41, and back to back limiter diodes 39. The regenerative loop is keyed into oscillation by threshold detector 51 which biases the attenuator 41 into a signal passing condition. Thus, the phase detector 70 always receives a signal centered at the intermediate frequency signal and objectionable noise normally occurring during high negative peak modulation is not discerned. During this condition of oscillation, L−R is approximately zero and both left and right signals appear to be approximately the same amplitude but opposite in phase. The listener to such a signal under these circumstances does not notice that the angle modulation has been lost due to the high negative amplitude modulation peaks, and in practice the switch over of the substitute intermediate frequency signal for the actual intermediate frequency signal is not at all discerned. Thus, objectionable noise normally experienced when a loss of carrier is phase detected is avoided by apparatus in accordance with FIG. 3.

Thus there has been described with respect to FIGS. 1 and 3 separate apparatus for providing a substitute intermediate frequency signal during periods of a loss of carrier frequency signal due to high negative modulation peaks or other phenomena. Those skilled in the art will recognize still other embodiments more particularly described by the claims which follow.

What is claimed is:

1. In a receiver for demodulating angle modulated signals, said receiver having a limiter means for removing amplitude excursions of said modulated signals, a circuit for maintaining said limiter with a signal during negative peak amplitude excursions of said angle modulated signals comprising:

means for detecting a temporary loss in signal during said negative amplitude excursions to said limiter; and means for generating a substitute input signal having a frequency at substantially the frequency of said modulated signals for said limiter in response to the detection of said temporary loss in signal whereby said limiter supplies an amplitude limited substitute signal during said peak negative amplitude excursions.

2. In a receiver for demodulating intermediate frequency signals which are phase or frequency modulated, a circuit for processing said signals comprising:

an amplifier for amplifying said intermediate frequency signals;

a limiter for limiting the peak amplitude of said amplified signals;

a feedback network for providing a signal from the output of said limiter to an input of said amplifer, said feedback network having a switching circuit for normally interrupting said feedback signal in the absence of a control signal, said feedback signal having a phase and amplitude for forcing said amplifier into oscillation; and means for providing a control signal to said switching circuit when said intermediate frequency signals are below a minimum amplitude whereby said amplifier is forced into oscillation thereby maintaining a signal to the input of said limiter.

3. The circuit of claim 2 wherein said feedback signal forces said oscillator to oscillate at substantially the frequency of said intermediate frequency signals.

4. The circuit of claim 2 wherein said control signal comprises an amplitude detected intermediate frequency signal generated internally to said receiver.

5. A receiver for demodulating broadcast signals modulated in phase by a difference signal comprising stereophonically related signals, and modulated in amplitude by a summation signal of said stereophonic related signals comprising:

means for converting said broadcast signals into intermediate frequency signals;

means for detecting the amplitude modulation of said intermediate frequency signals produced by said summation signal, said means providing a control signal when said amplitude is less than a predetermined minimum level, an amplifier connected to receive said intermediate frequency signals;

a limiter connected to said amplifier for limiting the maximum amplitude of signals from said amplifier;

a feedback control network connected to receive a signal representing the output signal produced by said limiter, and to deliver a feedback signal to said amplifier having a phase and amplitude for forcing said amplifier into oscillation;

means for normally interrupting said feedback signal until said means for detecting indicates said intermediate frequency signal is below said minimum level whereby said amplifier is forced into oscillation; and phase detector means connected to receive a signal from said limiter, said phase detector means providing a signal proportional to said difference signal when said intermediate frequency signal is greater than said minimum level and providing a fixed voltage level when said intermediate frequency signal is below said minimum level.

6. A receiver for demodulating broadcast signals having both amplitude and angle modulated components comprising:
   means for converting said broadcast signals into intermediate frequency signals;
   an amplitude detector connected to receive a signal from said means for converting, said amplitude detector providing a signal proportional to the amplitude modulation components in said broadcast signal;
   a threshold detector connected to said amplitude detector for providing a signal indicating when said broadcast signal has an amplitude below a predetermined minimum, whereby high negative amplitude modulation peaks are detected;
   a limiter connected to receive a signal from said means for converting;
   means connected to receive a signal from said limiter for providing a signal proportional to the angle modulation of said broadcast signals; and
   means for inserting a substitute intermediate frequency signal having an amplitude exceeding said predetermined minimum to said means for providing a signal proportional to angle modulation in response to a signal from said threshold detector, whereby said means for providing a signal proportional to the angle modulation is maintained with an input signal having an amplitude exceeding said predetermined minimum amplitude during said high negative amplitude modulation peaks.

7. In a receiver for receiving broadcast signals having both amplitude and angle modulation components, said receiver having a local oscillator and mixer for converting said broadcast signals to intermediate frequency signals, a signal processing circuit comprising:
   an amplifier for providing amplified intermediate frequency signals;
   a first limiter circuit having an input connected to said amplifier for providing a intermediate frequency signal having limited amplitude excursions;
   an amplitude detector connected to receive said intermediate frequency signal, said amplitude detector providing a signal proportional to the amplitude variations in said intermediate frequency signals;
   a threshold detector connected to said amplitude detector for indicating when the amplitude of said intermediate frequency signal is less than a predetermined minimum,
   a feedback network connecting the output of said first amplifier to the input of said first limiter, said feedback network having a transfer function for providing a feedback signal having a phase and amplitude for forcing said amplifier into an oscillating condition at a frequency substantially equal to the frequency of said intermediate frequency signals;
   means for applying said feedback signal to said amplifier when said threshold detector indicates that said intermediate frequency signal is below said predetermined level, whereby a substitute intermediate frequency signal is generated in said amplifier for said limiter;
   a second limiter circuit connected to receive a signal from said first limiter; and
   means connected to said second limiter providing a signal proportional to angle modulation components in said intermediate frequency signal.

* * * * *